United States Patent [19]
Schmitt-Landsiedel et al.

[11] Patent Number: 4,626,887
[45] Date of Patent: Dec. 2, 1986

[54] STATIC STORAGE CELL

[75] Inventors: Doris Schmitt-Landsiedel; Gerhard Dorda, both of Munich, Fed. Rep. of Germany

[73] Assignee: Siemens Aktiengesellschaft, Berlin & Munich, Fed. Rep. of Germany

[21] Appl. No.: 637,026

[22] Filed: Aug. 2, 1984

[30] Foreign Application Priority Data

Aug. 19, 1983 [DE] Fed. Rep. of Germany ....... 3330013

[51] Int. Cl.[4] ................... H01L 27/02; H01L 29/80; H01L 49/02; G11C 11/34
[52] U.S. Cl. ......................................... 357/43; 357/4; 357/6; 357/46; 357/23.7; 365/177; 365/182; 365/188
[58] Field of Search ............. 357/43, 22, 4, 6, 46, 357/16, 23.7; 365/177, 182, 188

[56] References Cited

U.S. PATENT DOCUMENTS

| 3,751,723 | 8/1973 | Shirn et al. | 357/4 |
| 3,986,173 | 10/1976 | Baitinger | 357/43 X |
| 4,090,254 | 5/1978 | Ho et al. | 357/43 X |
| 4,150,392 | 4/1979 | Nonaka | 357/43 |
| 4,516,146 | 5/1985 | Shannon et al. | 357/4 X |

OTHER PUBLICATIONS

"Elektronische Schaltkreise" by A. Moschwitzer and G. Jorke, VEB Verlag Technik, Berlin 1979, p. 141, FIG. 2.76c.
"Solid State Electronics", vol. 24, 1981, pp. 343–366, particularly FIG. 1.

Primary Examiner—Martin H. Edlow
Assistant Examiner—Terri M. Henn
Attorney, Agent, or Firm—Hill, Van Santen, Steadman & Simpson

[57] ABSTRACT

A static storage cell is formed of two cross-coupled inverters each containing a field effect transistor and a resistor element connected in series therewith. Each circuit node is thus connected via an additional logic element to a bit line allocated thereto. A storage cell is provided which is on as small as possible a semiconductor area and has a short access time. This is achieved by designing the additional logic elements as hot electron transistors which are respectively combined with one of the field effect transistors to form a common component which only requires the area of a field effect transistor. The cell is useful in VLSI semiconductor memories.

17 Claims, 3 Drawing Figures

STATIC STORAGE CELL

BACKGROUND OF THE INVENTION

The invention relates to a static storage cell formed of cross-coupled inverters. Each inverter is formed of a respective field effect transistor and resistor element connected in series therewith. Gates of the field effect transistors are coupled to respective bit lines.

Such a storage cell is known from the book "Elektronische Schaltkreise" by A. Möschwitzer and G. Jorke, VEB Verlag Technik, Berlin 1979, page 141, FIG. 2.76c, incorporated herein by reference. The additional logic elements therein are realized as field effect transistors via whose source-drain segments the circuit nodes are connected to a respective bit line.

SUMMARY OF THE INVENTION

An object of the invention is to specify a static storage cell of the type initially cited which can be realized on a significantly smaller semiconductor area than can comparable, traditional storage cells. This is achieved by providing a hot electron transistor of the tunnel emission type between a gate of the field effect transistor and the respective bit line wherein a collector of the hot electron transistor connects to the respective bit line, an emitter thereof connects to the word line, and a base connects with the gate of the field effect transistor. The hot electron transistor comprises an emitter layer, an insulator layer, a base layer, and a collector layer. The hot electron transistor and field effect transistor in each inverter are combined such that the emitter layer comprises an inversion layer in a channel region of the field effect transistor, the base layer represents the gate electrode of the field effect transistor, the insulator layer is disposed between the base layer and the channel region, and the collector layer comprises a terminal connected to the respective bit line. Source terminals of the field effect transistors are connected to the word line for addressing.

An advantage attainable with the invention is that two respective transistors of the aforementioned, known storage cell can be combined into a single semiconductor component which assumes two transistor functions and only requires the semiconductor area of a single MIS field effect transistor for its realization. The access time for the storage cell according to the invention is significantly shortened in comparison to that of traditional storage cells since the hot electron transistors employed represent rapidly switching elements and the interconnecting lines between the respective transistors combined into the components are eliminated.

DESCRIPTION OF THE PREFERRED EMBODIMENTS

Figure 1:
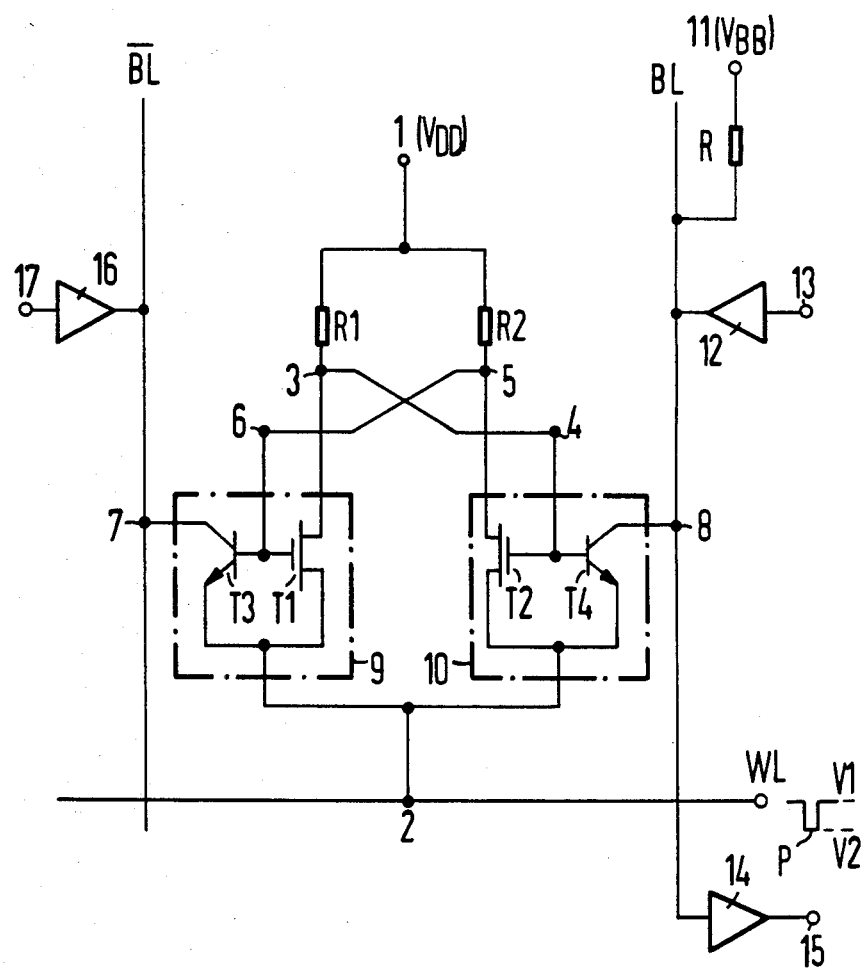
FIG. 1 is a static storage cell designed in accordance with the invention.

Two cross-coupled inverters which form a flip-flop circuit are shown in FIG. 1. The first inverter consists of the series connection of a field effect transistor T1 and of a resistor element R1 which is provided with end-side terminals 1 and 2. The terminal 1 is wired to a supply voltage $V_{DD}$, whereas the terminal 2 is connected to a word line WL which serves for addressing the storage cell. The second inverter, which is comprised of the series connection of a field effect transistor T2 and a resistor element R2, likewise is connected between the terminals 1 and 2. A circuit node 3 which is connected to the gate terminal 4 of T2 lies between T1 and R1. A circuit node 5 that is connected to the gate terminal of T1 lies between T2 and R2. The resistor elements R1 and R2 can be designed as field effect transistors of the depletion type whose gate terminals are connected to the source terminals. They can also be designed as field effect transistors of the enhancement type whose gate terminals are connected to the drain terminals, or can be designed as strip-shaped structures of resistance-affected material or the like.

T3 indicates a hot electron transistor of the tunnel emission type whose base terminal coincides with the gate terminal T1. It comprises a collector terminal 7 which is wired to a bit line $\overline{BL}$, whereas its emitter is connected to the terminal 2. Another hot electron transistor of the tunnel emission type is referenced T4. This is provided with a base terminal that coincides with the gate terminal of T2 and is also provided with a collector terminal 8 which is wired to a bit line BL. Its emitter is likewise connected to terminal 2. Hot electron transistors are known, for example, from "Solid State Electronics", Vol. 24, 1981, pages 343–366, particularly FIG. 1, incorporated herein by reference.

The transistors T1 and T3 are combined to form a common component 9, as indicated in FIG. 1, and the transistors T2 and T4 are combined to form a common component 10. The bit line BL is wired via a resistor element R to a voltage $V_{BB}$ which is supplied to a terminal 11. BL is also connected to the output of a write amplifier 12 whose input is referenced 13 and is also connected to the input of a read amplifier 14 which comprises an output 15. The bit line $\overline{BL}$ is connected to the output of a write amplifier 16 which comprises an input 17.

The identically constructed components 9 and 10 which are schematically shown in FIG. 1 shall be explained in greater detail below with reference to component 9 shown in FIG. 2.

The component is provided on a body 18 of doped semiconductor material, for example of p-doped silicon having an impurity concentration of about $10^{15}/cm^3$, in which two regions 19 and 20 proceeding from a boundary surface 18a are inserted. The regions 19 and 20 are, for example n+ doped. These represent the source region and the drain region of a field effect transistor whose gate electrode is formed of a metallic or metallically conductive layer 21 which covers the channel region 22 lying between 19 and 20. A very thin insulator layer 23 lies between the layer 21 and the boundary surface 18a. The thickness of the insulator layer 23 consisting, for example, of $SiO_2$ or $Si_3N_4$, preferably amounts to about 2 to 5 nm. The layer 21 advantageously is formed of a high melting point metal, for example of Ta, Ti, Mo or W, or of a silicide of one of these metals, i.e. $TaSi_2$, $TiSi_2$, $MoSi_2$ or $WSi_2$, and can have a thickness of about 10 nm. Situated above the metallic layer 21 is a polycrystalline layer 24 having a thickness of about 10 to 100 nm and preferably has a p-doping which is given, for instance, by a doping concentration of $10^{14}$ through $10^{15}/cm^3$. Boron can be employed as the dopant. Situated on the layer 24 is a metallic or metallically conductive layer 25 whose thickness can be arbitrarily selected, but is nonetheless preferably greater than the layer thickness of 24. The layer 25 preferably comprises one of the metals or silicides which have already been cited in the context of the layer 21. An electrically insulating layer (field oxide layer) which covers the surface 18a laterally of the parts 19, 20, and 22 is shown adjacent to the layers 21, 24, and 25.

The source region 19 and the drain region 20 are provided with leads 27, 28 that are connected to the circuit points 2 and 3. The metallic layer 21 is provided with the terminal 6 (FIG. 1). The semiconductor body 18 is also applied to ground potential via a terminal 29. The metallic layer 25 is connected to the circuit point 7.

When a voltage that lies above a value referred to as a first threshold voltage is supplied via the terminal 6 to the gate electrode of the field effect transistor (the gate electrode being formed of the layer 21), then a depletion zone between the regions 19 and 20 which proceeds from the boundary surface 18a is formed in the semiconductor body 18 below layer 21, whereby an inversion layer 30 which forms an n-conductive channel between the regions 19 and 20 builds up within the depletion zone directly at the boundary surface 18a.

The inversion layer 30 represents the emitter layer of a hot electron transistor (HET) of the tunnel emission type which additionally comprises the layers 23, 21, 24 and 25. The layer 21 thus forms a metallic base layer of the HET. The insulator layer 23 is situated between the layer 21 and the emitter layer 30. The polycrystalline silicon layer 24 together with the metallic layer 25 represents the collector layer of the HET.

Figure 3:
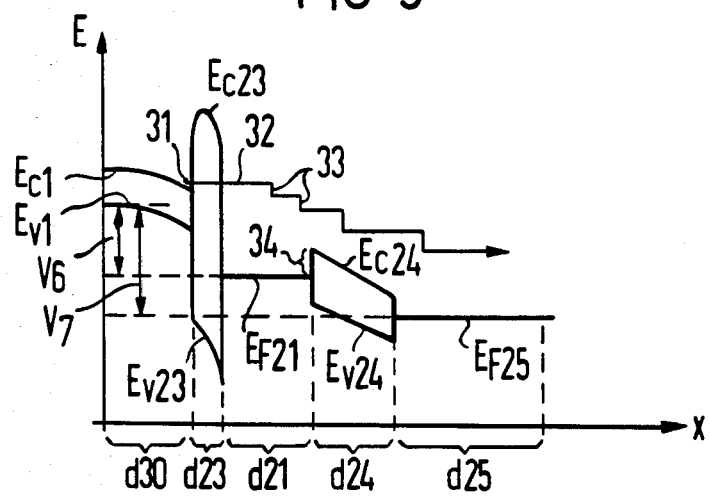
FIG. 3 is a band structure diagram for illustrating operation of the device shown in FIG. 2.

The function of the HET is described below with reference to the energy band structure diagram shown in FIG. 3. This shows energy states E along the vertical axis which appear as a function of various distances x from the inversion layer or the emitter layer 30. These distances are provided on an axis x which penetrates the layers of the HET in the vertical direction in FIG. 1, i.e. perpendicular to the boundary surface 18a. Successive segments of the x-axis are allocated to the layers 20, 23, 21, 24 and 25, whereby the lengths d30, d23, d21, d24 and d25 of these segments diverge from the actual layer thicknesses D30, D23, D21, D24 and D25 of the layers 30, 23, 21, 24 and 25 for reasons of clear presentation. Thus, for example, the segment d23 is greatly elongated in comparison to the segments d30, d21, d24 and d25. The upper limit of the valency band of the semiconductor material of 18 is referenced $E_{v1}$ in the segment d30 allocated to the inversion layer 30, whereas $E_{c1}$ represents the energy level of the electrons within the inversion layer 30. In segment d23, the upper line $E_{c23}$ represents the lower limit of the conduction band of the insulator layer 23, whereas the lower line $E_{v23}$ denotes the upper limit of the valency band. The respective Fermi levels $E_{F21}$ and $E_{F25}$ are provided in the segments d21 and d25, whereas the lower limit of the conduction band of the layer 24 is illustrated by $E_{c24}$ in the segment d24 and the upper limit of the valency band is represented therein by $E_{v24}$. Given a sufficiently low thickness D23 of the insulator layer 23, electrons proceed from the inversion layer 30 as a result of the tunnel effect and through the insulator layer 23 into the metallic base layer 21, as indicated by means of the horizontal straight-line 32. The electrons are indicated in FIG. 3 in accordance with their energy level, for example by the point 31. They lose energy due to scatter at voids and at the crystal lattice of the layer 21. This is expressed by means of the stepped curve 33. When the energy level of these electrons is subsequently still high enough that they can overcome the energy threshold 34 at the boundary surface between the layers 21 and 24, then they proceed into the collector layer of the HET which consists of the layers 24 and 25. The magnitude of the voltages $V_6$ and $V_7$ supplied via the terminals 6 and 7 is likewise indicated in FIG. 3.

The component 10 is correspondingly constructed and is provided with the terminals 2, 4, 5 and 8 in accordance with FIG. 1.

In considering the functioning of the circuit according to FIG. 1, it is assumed that a logical "1" is stored in the storage cell when the flip-flop is situated in that status, and wherein T1 is conductive and T2 is inhibited. Accordingly, the circuit points 5 and 6 are at a higher potential than the circuit points 3 and 4. In addition to the left-hand circuit branch of the flip-flop which extends from 1 over R1, 3, and T1 to the terminal 2, a second circuit branch is formed which proceeds from 1 over R2, 5, and the base-emitter segment of T3 to terminal 2. A tunnel current which is initiated by a voltage at the terminal 6 exceeding the threshold voltage of T1 with reference to the potential on the word line WL, and which flows between the base layer 21 and the emitter layer 30 of T3, flows in this branch. In addition to T2, T4 is also inhibited because the low potential of the terminal 4 or of the base layer 21 of T4 hardly differs from the potential of the emitter layer 30 of T4, or from the potential of the word line WL due to the conductive transistor T1.

When reading a stored signal, the corresponding cell is first addressed, this occurring by means of lowering the potential on the allocated word line WL from a value V1, which corresponds to about $V_{DD}/2$, to a value V2 which corresponds to the reference potential. A voltage $V_{BB}$ which, for example, likewise amounts to $V_{DD}/2$ is also supplied to the terminal 11. A voltage $V_7$ (FIG. 3) is then present between the collector and the emitter of T4 for the selected storage cell. Practically no voltage is present between the base and the emitter because of the conductive transistor T1. T4 thus remains inhibited so that the potential at the input of 14 approximately corresponds to $V_{BB}$, a logical "1" thus appearing at the output 15.

When a logical "0" has been stored, then T1 inhibits whereas T2 is conductive. Significantly higher potentials thus lie at the points 3 and 4 than at the points 5 and 6. When readout is carried out in this case, then in addition to the voltage $V_{BB}$ supplied to the collector terminal 8 via 11, a voltage $V_6$ (FIG. 3) relative to the reference potential V2 is applied via the terminal 4 to the base layer 21 of T4. A current which is dependent on the tunnel current existing between the layers 30 and 21 of T4 thus flows in the circuit branch 11, R, 8, T4 and 2. A voltage drop thus arises at R, the potential at the the input of 14 being reduced relative to $V_{BB}$ by the voltage drop so that a logical "0" can be tapped at the output 15.

In order to write a "0" into a storage cell, a voltage is supplied via the input 13 of the write amplifier 12, said voltage placing the bit line BL at a potential that lies between $V_1$ and $V_{DD}$ or exceeds $V_{DD}$. Since, given the assumption that a "1" has been previously stored, the terminal 4 or the base layer 21 of T4 lies at a potential which approximately corresponds to the potential of WL but which was lowered to $V_2$ when the cell was addressed. A voltage at the collector-base segment of T4 is of such a magnitude that a tunnel current flows through the layer 24. A current dependent thereon then flows through the layer 24. A current dependent thereon then flows through the circuit branch 13, 12, 8, the collector-base segment of T4, 4, 3, T1 and 2. Accordingly, a voltage drop arises at the bulk resistance of T1 such that the potential at the circuit point 4 is boosted. T2 becomes conductive as a result thereof. This results in the fact that T1 is inhibited. A "0" is thus written into the storage cell. When a "0" has already been previously stored, then a high potential is present at 4 such that the potential boost of BL occurring via 12 is inadequate in order to induce a tunnel current between collector and base of T4.

Corresponding events sequence when a "1" is written, whereby the bit line $\overline{BL}$ is boosted to a potential in this case which lies between $V_1$ and $V_{DD}$ or exceeds $V_{DD}$. It is boosted thereto by means of a voltage supplied to the input 17 of the write amplifier 16. When a "0" has been previously stored, then the current branch 17, 17, 7, collector-base segment of T3, 6, 5, T2, and 2 is crossed by a current by means of which the potential at the circuit point 6 is boosted to such degree that T1 becomes conductive and T2 is inhibited.

As already described, the selection of a storage cell occurs by means of a brief lowering of the potential on the word line WL to which the cell is adjacent. This is identified by the pulse P. After the write-in or read-out, the potential on BL is again boosted to $V_1$. A falsification of the signal written into the storage cell under consideration is prevented given write-in into other storage cells that lie at common bit lines BL and $\overline{BL}$ together with the storage cell under consideration.

The potential to which BL is boosted during a write event must differ from V1 by an amount that is smaller than the critical voltage at which a tunnel current begins to flow between collector and base of T4. This condition must be observed in order to avoid a falsification of rolled-in signals due to write events at non-addressed cells. Furthermore, the potential at the circuit point 4 of a non-addressed cell in which a "0" is stored must differ from the potential to which the bit line BL is lowered when reading a "0" from another cell adjacent to BL by an amount that is smaller than the critical voltage.

According to another preferred embodiment of the invention, the semiconductor component 9 or 10 is constructed on a body 18 consisting of a p-doped III-V semiconductor compound, for example GaAs having a doping concentration of, for example, $10^{16}/cm^3$. The insulator layer 23 preferably consists of AlGaAs. Replacing the polycrystalline silicon layer 24 is a layer consisting of p-doped GaAs with Be as a dopant. The layer 21 is preferably formed of a highly doped, n-conductive III-V semiconductor compound, for example GaAs with Si as dopant, which behaves similar to a metal with respect to its electrical conductivity given a doping concentration of about $10^{18}/cm^3$. The layer 25 thus also advantageously consists of the same material as the layer 21.

Given a further embodiment of the invention, the semiconductor component 9 or 10 is designed such that the previously described layer 24 is replaced by a second insulator layer which preferably corresponds to the insulator layer 23 in terms of structure and thickness. In case a semiconductor body 18 of p-doped silicon is provided, the second insulator layer consists of $SiO_2$ or $Si_3N_4$. It consists of AlGaAs given a semiconductor body consisting of GaAs. Its thickness preferably amounts to about 2 to 5 nm.

Figure 2:
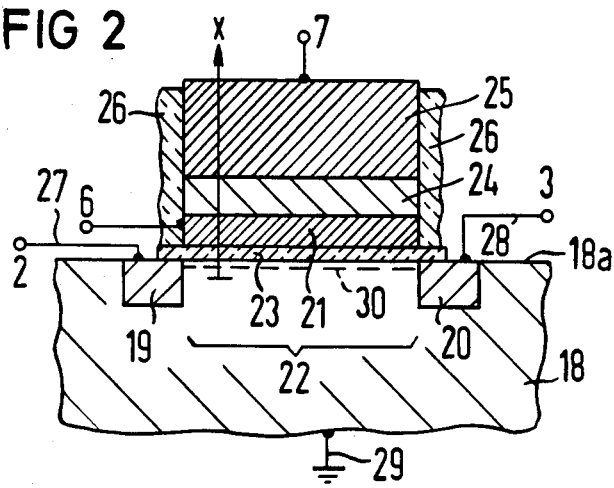
FIG. 2 is a cross-section of a component schematically illustrated in FIG. 1 which comprises an MIS field effect transistor and a hot electron transistor.

The manufacture of the semiconductor components according to FIG. 2 initially corresponds to the traditional manufacture of a field effect transistor. After a field oxide layer 26 covering the semiconductor body surface-wide has been etched away above the channel region 22 and above the regions 19 and 20, and after an insulator layer 23 has been thermally grown in the etched region, a large-surface mask which contains an opening which defines the lateral dimensions of the layers 21, 24, and 25 is applied to the structure which has arisen in such manner. The semiconductor body consists, for example of doped silicon. The layers 21, 24, and 25 are then successively applied upon use of this mask. After application, the polysilicon layer 24 is provided with a p-doping under given conditions before the layer 25 is applied, the p-doping having a concentration of from $10^{14}$ to $10^{15}/cm^3$. After removal of the mask, an implantation of a dopant occurs for generating the regions 19 and 20. The layers 21, 24, and 25, as well as the field oxide layer, serve as parts of a doping mask (self-adjustment). After the application of the terminal lines 27 and 28 which contact the parts 19 and 20 through contact holes in the insulator layer 23, finally the previously etched-off parts of the field oxide layer above the regions 19 and 20 are again built up to such degree that the field oxide layer extends up to the lateral limiting surfaces of the layers 21, 24, and 25, as indicated by the parts 26 in FIG. 2. A further lead which contacts the layer 25 and which is provided with the terminal 7 is subsequently laid.

Although various minor changes and modifications might be proposed by those skilled in the art, it will be understood that we wish to include within the claims of the patent warranted hereon all such changes and modifications as reasonably come within our contribution to the art.

We claim as our invention:
1. A static storage cell, comprising:
first and second cross-coupled inverters respectively formed of first and second field effect transistors and first and second resistor elements connected in series thereto;
a first circuit node between the first field effect transistor and the first resistor element being connected to a gate terminal of the second field effect transistor;
a second circuit node between the second field effect transistor and the second resistor element being connected to a gate terminal of the first field effect transistor;
said first and second circuit nodes being respectively connected to base terminals of respective second and first hot electron transistors (HETs), collector terminals of which being connected to respective second and first bit lines and emitter terminals of which being connected to an addressing word line; the first and second hot electron transistors being of a tunnel emission type and each having an emitter layer, an insulator layer, a base layer, and a collector layer;
said first and second field effect transistors respectively having source and drain regions which are inserted in a body of doped semiconductor material, a channel region lying between them at which an inversion layer forms, and a gate electrode covering said channel region;

the first and second hot electron transistors being combined with te respective first and second field effect transistors such that the HET transistor emitter layer is the inversion layer in the channel region of the field effect transistor, the HET base layer is the gate electrode of the field effect transistor, the insulator layer is disposed between the base layer and the channel region, collector layer has a terminal connected to the respective bit and a source terminal connected to the source region of the field effect transistor forming a terminal of said emitter of the respective hot electron transistor connected to said addressing word line.

2. A static storage cell according to claim 1 wherein the HET base layer comprises a metal selected from a high melting point metal group consisting of Ta, Ti, Mo, W or a silicide of these metals.

3. A static storage cell according to claim 1 wherein the HET base layer comprises a highly doped III-V semiconductor compound.

4. A storage cell according to claim 3 wherein the semiconductor compound comprises GaAs which is provided with an n-doping.

5. A static storage cell according to claim 1 wherein the collector layer comprises a metallically conductive layer and a polycrystalline silicon layer.

6. A static storage cell according to claim 5 wherein the silicon layer is provided with a p-doping and is situated between the metallically conductive layer and the base layer.

7. A static storage cell according to claim 1 wherein the collector layer comprises a metallically conductive layer and an intermediate layer situated between said metallically conductive layer and the base layer, said intermediate layer comprising a III-V semiconductor compound.

8. A static storage cell according to claim 7 wherein the semiconductor compound comprises GaAs which is provided with a p-doping.

9. A static storage cell according to claim 1 wherein the collector layer comprises a metallically conductive layer and a second insulator layer situated between the metallically conductive layer and the base layer.

10. A static storage cell according to claim 1 wherein the collector layer comprises a metallically conductive layer and said metallically conductive layer which represents one portion of the collector layer comprising a metal selected from a high melting point metal group consisting of Ta, Ti, Mo, W, or a silicide of the aforegoing metals.

11. A static storage cell according to claim 1 wherein the collector layer comprises a metallically conductive layer which represents one portion of the collector layer, and said metallically conductive layer comprising a highly doped III-V semiconductor compound.

12. A static storage cell according to claim 11 wherein the semiconductor compound comprises GaAs provided with an n-doping.

13. A static storage cell according to claim 1 wherein a thickness of the HET insulator layer situated between the base layer and the channel region is in a range from 2 to 5 nm.

14. A static storage cell according to claim 9 wherein the second insulator layer has a thickness in a range from 2 to 5 nm.

15. A static storage cell, comprising:

first and second inverters;

the first and second inverters each comprising an FET and series connected load resistance;

a node between the resistance and FET connecting to a gate of the other FET such that the first and second inverters are cross-coupled;

one end of a channel of the FETs in both inverters connecting to an addressing word line;

a hot electron transistor (HET) associated with each of the first and second inverters having its base connected to a gate of the corresponding FET, its collector connecting to respective first or second bit lines, and its emitter connecting to a channel of the respective FET; and the FET and hot electron transistor associated with each inverter being combined as a single semiconductor structure wherein in a substrate, source and drain regions are provided with a channel therebetween for the FET, and a thin insulator layer is provided over the channel region, a gate electrode is formed over the channel region on the insulator layer, an inversion layer which can be generated in the channel region comprising the emitter of the HET, the base of the HET being said FET metal gate, and the collector of the HET comprising a metallically conductive layer over the gate.

16. A static storage cell according to claim 15 wherein the HET collector comprises a polycrystalline layer and a metallic layer.

17. A static storage cell according to claim 15 wherein the HET collector comprises a second insulating layer and a metallic conductive layer.

* * * * *